(12) United States Patent
Zhuang

(10) Patent No.: US 8,497,723 B2
(45) Date of Patent: Jul. 30, 2013

(54) LOW-HYSTERESIS HIGH-SPEED DIFFERENTIAL SAMPLER

(75) Inventor: Jingcheng Zhuang, San Diego, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 13/300,089

(22) Filed: Nov. 18, 2011

(65) Prior Publication Data

US 2013/0127507 A1    May 23, 2013

(51) Int. Cl.
*H03K 3/00* (2006.01)

(52) U.S. Cl.
USPC .......................................... 327/219; 327/212

(58) Field of Classification Search
USPC ................. 327/185, 199, 202, 203, 205, 206, 327/208, 210–212, 214, 215, 218, 219, 225
See application file for complete search history.

(56) References Cited

U.S. PATENT DOCUMENTS

| 4,814,642 A | * | 3/1989 | Kleks | .............................. 327/80 |
| 6,031,769 A | * | 2/2000 | Kim | .............................. 365/194 |

OTHER PUBLICATIONS

P. Heydari et al., Design of Ultra High-Speed CMOS CML Buffers and Latches, Proceedings of the 2003 International Symposium on Circuits and Systems, May 25-28, 2003, pp. II-208-II-21, vol. 2.
M.R. Ahmadi et al., A 5Gbps 0.13 um CMOS Pilot-Based Clock and Data Recovery Scheme for High-Speed Links, IEEE Journal of Solid-State Circuits, vol. 45, No. 8, Aug. 2010.
M. Usama et al., New CML Latch Structure for High Speed Prescaler Design, Canadian Conference on Electrical and Computer Engineering, May 2-5, 2004, pp. 1915-1918, vol. 4.
J. Zhuang, Low-Blind-Period Differential Sampler for High-Speed Serial Link Receivers, IEEE Transactions on Circuits and Systems—II: Express Briefs, vol. 58, No. 8, Aug. 2011.

* cited by examiner

*Primary Examiner* — William Hernandez
(74) *Attorney, Agent, or Firm* — Hamilton & Terrile, LLP; Michael Rocco Cannatti

(57) ABSTRACT

A low-hysteresis high-speed latch circuit is disclosed which isolates a sample stage and hold stage from one another during a latch clock phase and simultaneously shorts the output nodes together during the latch clock phase to reduce hysteresis of the latch.

23 Claims, 6 Drawing Sheets

LOW-HYSTERESIS HIGH-SPEED DIFFERENTIAL SAMPLER

BACKGROUND OF THE INVENTION

1. Field of the Invention

The present invention relates in general to the design and use of a comparator and latch circuit. In one aspect, the present invention relates to a data sample circuit and methods for operating same.

2. Description of the Related Art

In high data-rate applications such as multimedia applications, there is increasing demand for high speed serial links which provide high speed signal conditioning and data capture capabilities, especially as the physical data rates continue to increase from one generation to the next. Sampler circuits are typically included in signal-conditioning systems (e.g., analog-to-digital converters), and function to successively capture or quantize a fast-moving input signal (e.g., the output of an analog signal processor) to provide samples that facilitate further processing in an associated signal-conditioning system (e.g., the digital signal processor). Conventional sampler circuits are implemented with current-mode logic (CML) latches, such as the CML latch 100 shown in FIG. 1, which samples the input signal, Vin and Vinx, in two phases referred to as the transparent phase and latch phase. In the transparent phase, the input signal (Vin and Vinx) is amplified with the CML amplifier pair (M1/R1 and M2/R2) when the clock signal clkx is high to turn on the input CML pair (M1 and M2), thereby allowing the output signals (out and outx) to follow the input signals (Vin and Vinx). In the latch phase, the input amplifier (M1, M2) is turned off and the cross-coupled latch pair (M3, M4) is turned on to amplify and latch the input voltage signal when the clock signal clk is high. The final voltage of the transparent phase or the initial voltage of the latch phase is thus latched by the cross-coupled nMOS pair M3, M4. The cross-coupled pair M3, M4 usually has a sufficient gain to ensure the input is latched promptly, and also has an output swing (negative or positive) at the end of the latch phase needed to overcome the output signal. This results in a strong hysteresis because, in the next transparent phase, the CML latch 100 needs to overcome such a high initial voltage and sense the input signal, which may be much smaller than the initial voltage.

To illustrate the performance of the latch 100, reference is now made to FIG. 2 which depicts timing diagram 200 for a conventional CML latch in which a test input signal Vin 203 is sampled at the rising edge of clock clk 204 using a load phase 201 and latch phase 202. In the load phase 201, the input amplifier transistors (M1, M2) sample the input signal 203, causing the output signal Vout 205 to follow the input signal Vin 203. In the latch phase 202, the cross-coupled latch pair (M3, M4) holds the output signal Vout 205 at the value sampled at the rising edge of clock clk 204. Because the CML latch in the load phase 201 has a time constant that is determined by the load resistance and capacitance at the latch output, the edge transition rate 206 of the output signal 205 can be quite slow, depending on the output load resistance and capacitance. This delayed transition rate 206 can reduce the data sampling eye, thereby impairing reliability and performance. When the input signal Vin 203 is near its zero-crossing point, a blind period is created where the sampler cannot reliably distinguish the polarity of its input signal because of the metastability and hysteresis of the sampler. As a result, the blind period reduces the sampling window, in which the sampler can properly operate, so that it is narrower than the actual eye width because of the non-ideal behavior of the sampler. Such degradation becomes more significant in high-speed receiver applications because of the reduced eye width.

SUMMARY OF EMBODIMENTS

Broadly speaking, the present disclosure provides a low-hysteresis latch which decouples the output latch from the input amplifier to significantly reduce the initial voltage of the next transparent phase, while still achieving fast latching operation and providing a high output voltage for the following latch/hold stage. Selected embodiments of the low-hysteresis latch isolate the amplifier output nodes and the latch output nodes with a pair of transistors (e.g., a PMOS isolation pair) that are configured as a common-gate buffer stage to provide a high impedance for the cross-coupled latch pair (to achieve high output voltage) while providing a low impedance for its input to limit the differential swing of the output nodes of the CML input pair. In addition, selected embodiments of the low-hysteresis latch use one or more pass gate or reset transistors for resetting the cross-coupled latch pair in the next transparent period to significantly reduce the hysteresis.

In selected example embodiments, a latch circuit and associated method of operation are provided for latching an input signal using load and latch clock phases. The latch circuit includes a sample circuit stage that is controlled by a first clock signal and has one or more transistors which form a single or differential input amplifier for receiving first and second input signals and generating first and second internal output signals at first and second internal nodes, respectively, during a load clock phase. The latch circuit also includes an isolation circuit stage coupled between the first and second internal nodes and the first and second output nodes of the electronic latch circuit, where the isolation circuit stage is controlled to electrically isolate the first and second internal nodes from the first and second output nodes during the load clock phase, and to electrically connect the first and second internal nodes to the first and second output nodes during a latch clock phase. In selected embodiments, the isolation circuit stage includes first and second pMOS transistors controlled by a first clock signal, where the first pMOS transistor is coupled between the first internal node and the first output node, and where the second pMOS transistor is coupled between the second internal node and the second output node. When configured as a common-gate buffer stage, the first and second pMOS transistors provide low impedance during the load clock phase to limit the differential swing of the first and second internal output nodes, and provide high impedance for the cross-coupled transistors during the latch clock phase. In addition, the latch circuit includes a hold circuit stage coupled to the first and second output nodes and controlled by a second complementary clock signal, where the hold circuit stage includes a pair of cross-coupled transistors forming an output latch for receiving first and second input signals and generating first and second output signals at the first and second output nodes during the latch clock phase. A reset circuit may also be included in the latch circuit which is coupled between the first and second output nodes for electrically connecting the first and second output nodes during the load clock phase. In selected embodiments, the reset circuit includes a pMOS transistor coupled between the first and second output nodes and gated by a first clock signal, and an nMOS transistor coupled between the first and second output nodes and gated by a second complementary clock signal. At the output of the latch circuit, a gain circuit stage is coupled to the first and second output nodes for amplifying the first and second output signals, and an output latch stage is coupled to the gain circuit stage for holding the amplified first and second output signals. In selected embodiments, the gain circuit stage is implemented as a differential amplifier, and the output latch is implemented as a D flip-flop which stores the amplified first and second output signals during the load clock phase. The disclosed latch circuit may be implemented in a PCI Express bus, HyperTransport bus, or any high speed serial link.

BRIEF DESCRIPTION OF THE DRAWINGS

The present invention may be better understood, and its numerous objects, features and advantages made apparent to those skilled in the art by referencing the accompanying drawings. The use of the same reference number throughout the several figures designates a like or similar element.

DETAILED DESCRIPTION

A low-hysteresis high-speed latch circuit and method of operation are described in which a sample stage is isolated from a hold stage by inserting a pair of isolation transistors configured as a common-gate buffer stage to provide high impedance for the hold stage during the transparent phase to achieve high output voltage while providing low impedance input to the hold stage during the latch phase to limit the differential swing of the output nodes of the sample stage. In addition, a pair of pass gate transistors are inserted between gate nodes of a cross-coupled latch pair in the hold stage and controlled by the clock signals to short the nodes during the transparent phase to reduce hysteresis in the latch. The disclosed low-hysteresis high-speed latch circuit may be used in a variety of high-data-rate applications, including a low-blind-period sampler circuit which includes a low-hysteresis master latch, an amplifier or buffer, and a sense-amplifier-based slave latch followed by an RS flip-flop. The sense amplifier followed by an RS flip-flop is chosen to produce a full-swing output without additional conversion circuitry. Because of the large swing in the slave stage, a differential amplifier or buffer is used to reduce the reverse leakage back into the master latch.

Various illustrative embodiments of the present invention will now be described in detail with reference to the accompanying figures. While various details are set forth in the following description, it will be appreciated that the present invention may be practiced without these specific details, and that numerous implementation-specific decisions may be made to the invention described herein to achieve the device designer's specific goals, such as compliance with process technology or design-related constraints, which will vary from one implementation to another. While such a development effort might be complex and time-consuming, it would nevertheless be a routine undertaking for those of ordinary skill in the art having the benefit of this disclosure. For example, selected embodiments of the present invention are implemented, for the most part, with electronic components and circuits known to those skilled in the art, and as a result, circuit details have not been explained in any greater extent since such details are well known and not considered necessary to teach one skilled in the art of how to make or use the present invention. In addition, selected aspects are depicted with reference to simplified circuit schematic diagrams and block diagram drawings without including every circuit detail or feature in order to avoid limiting or obscuring the present invention. Such descriptions and representations are used by those skilled in the art to describe and convey the substance of their work to others skilled in the art.

Figure 1:
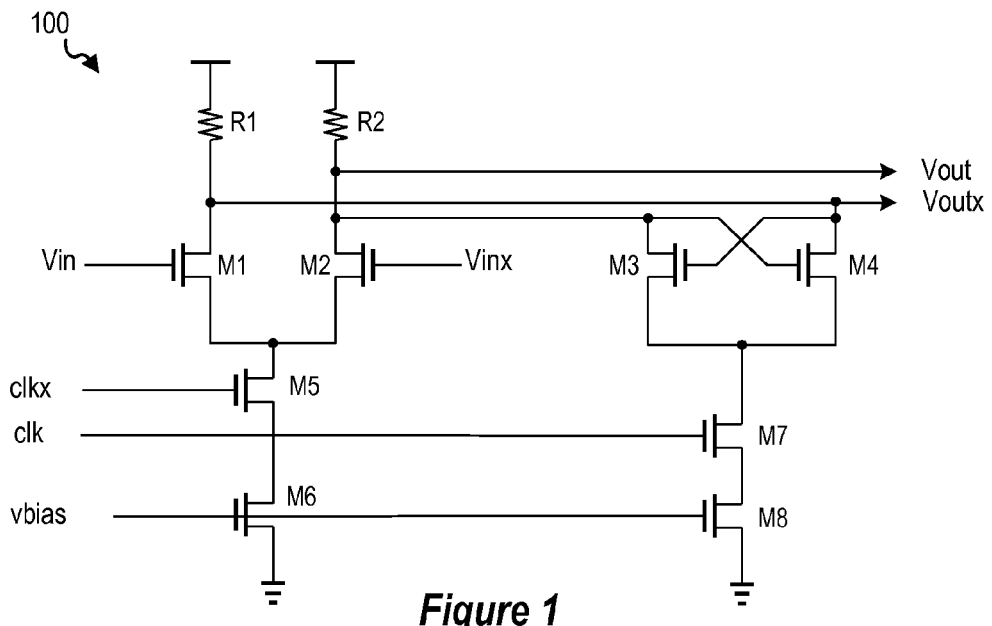
FIG. 1 shows a simplified circuit schematic diagram of a conventional current-mode logic (CML) latch.
Figure 2:
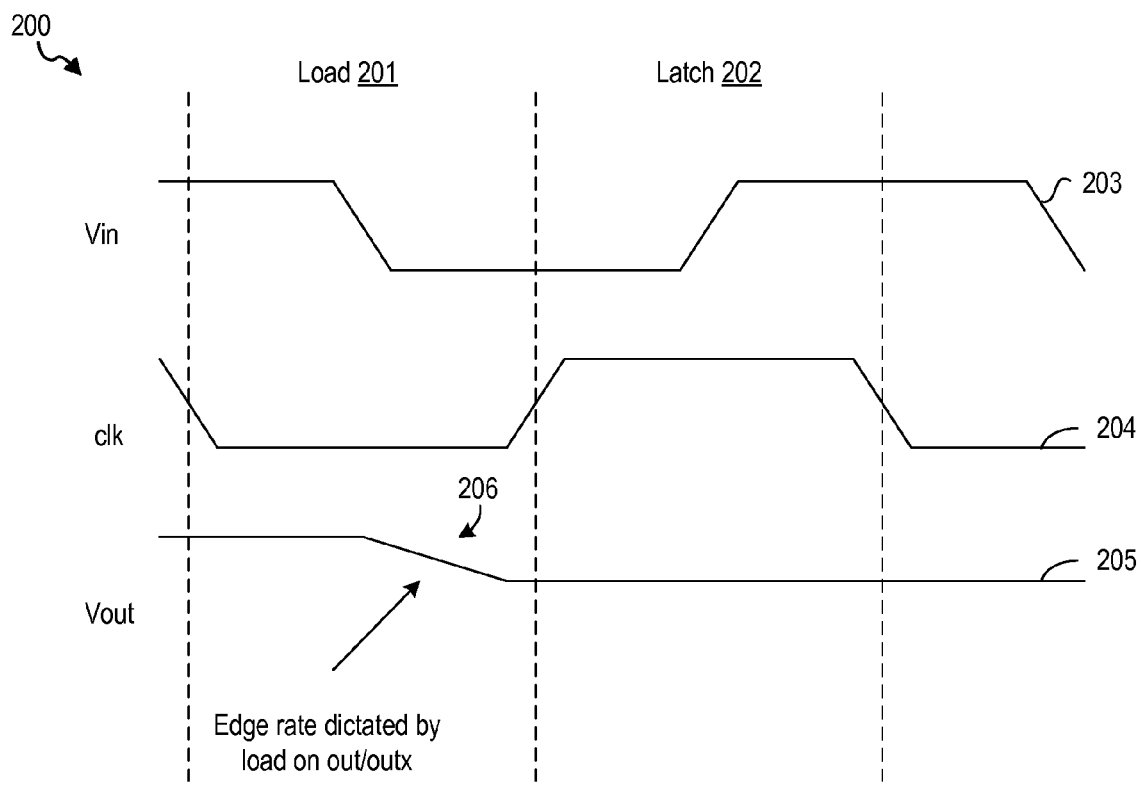
FIG. 2 shows a timing diagram of a conventional CML latch.
Figure 3:
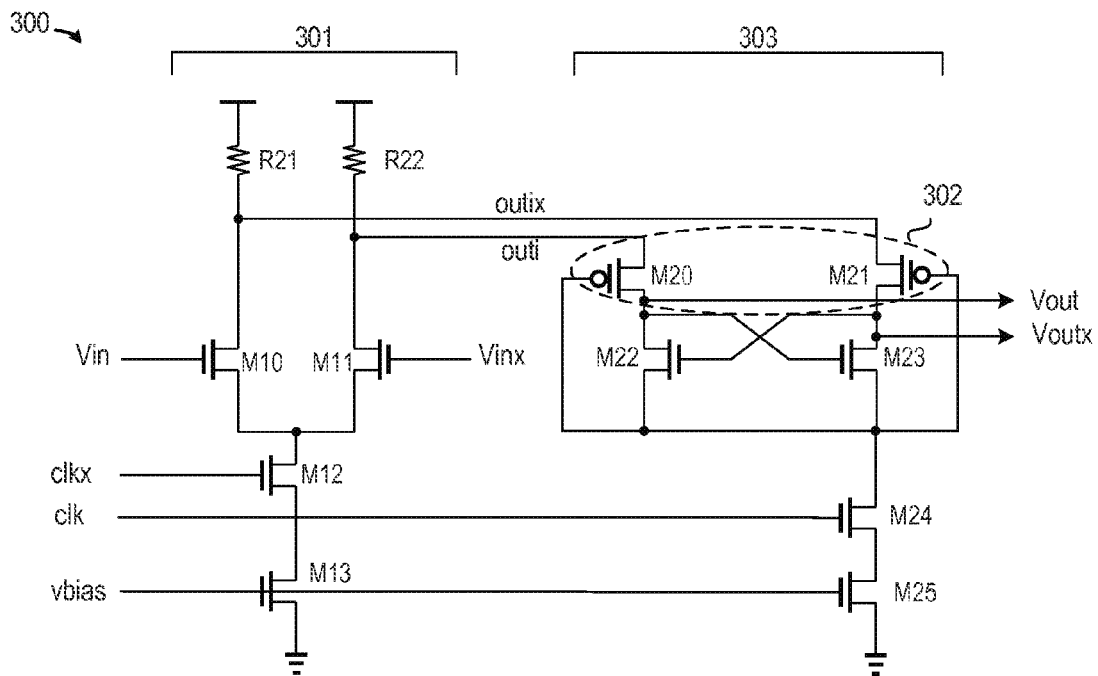
FIG. 3 shows a simplified circuit schematic diagram of a CML latch with isolation transistors for decoupling the cross-coupled latch pair from the CML amplifier in accordance with selected embodiments of the present disclosure.

Referring now to FIG. 3, there is shown a simplified circuit schematic diagram of a CML latch 300 with isolation transistors M20, M21 for decoupling the cross-coupled latch pair M22, M23 from the CML amplifier M10, M11 in accordance with selected embodiments of the present disclosure. As depicted, the CML latch 300 includes an input sample stage 301 coupled across an isolation stage 302 to an output hold stage 303. The input sample stage 301 may be formed with differential nMOS transistors M10 and M11 coupled to a sample stage transistor M12 and a current source, such as a transistor M13 controlled by the vbias signal or a highly resistive clocking transistor (not shown). As will be appreciated, the differential transistors M10, M11 could also be implemented with pMOS transistors by switching the polarity of the circuit signals. The differential transistors M10 and M11 are coupled to receive the input signals (Vin and Vinx) and the sample stage transistor M12 is coupled to receive a first complementary clock signal clkx, thereby forming a CML amplifier. The output hold stage 303 is formed with cross-coupled nMOS transistors M22, M23 coupled to a hold stage transistor M24 and a current source transistor M25 controlled by the vbias signal. The cross-coupled transistors M22, M23 are coupled to receive the internal output signals (outi and outix) across the isolation transistors M20, M21, and the hold stage transistor M24 is coupled to receive a second clock signal clk. The isolation stage 302 may be implemented with a pair of pMOS transistors M20, M21 inserted between the input nMOS pair (M10 and M11) and the cross-coupled transistors M22, M23.

When the CML latch 300 is in the transparent or load phase (clk is LOW and clkx is HIGH), the input signal (Vin and Vinx) is amplified with the CML amplifier pair (M10 and M11) when the clock signal clkx applied to the gate of sample stage transistor M12 is high to turn on the input CML pair (M10 and M11), thereby allowing the output signals (out and outx) to follow the input signals (Vin and Vinx). However, during this transparent phase, the pair of pMOS isolation transistors (M20, M21) are OFF, thereby providing a high impedance path between the cross-coupled nodes (at the gates of transistors M22, M23) to achieve a high cross-coupled gain, latch the signal rapidly, and produce a highly desirable wide-swing output. By disconnecting the input sample stage 301 from the output hold stage 303 during the load phase, the isolation stage 302 effectively removes or reduces the hysteresis that would otherwise be created by the hold stage 303.

When the CML latch 300 is in the latch phase (clk is HIGH and clkx is LOW), the input amplifier (M10, M11) is turned OFF and the cross-coupled latch pair (M22, M23) is turned ON to amplify and latch the input voltage signal when the clock signal clk is HIGH. In addition, the pMOS transistors M20, M21 are turned ON to exhibit low impedance between the output nodes from the sample stage 301 (outix and outi) to significantly reduce their swings or the initial voltage of the following transparent phase. At the beginning of the latch phase, the pMOS isolation transistor pair M20, M21 also acts as a common-gate amplifier to amplify the output signals from the sample stage 301 (outix and outi) and pass them onto latch output nodes out, outx. This helps speed up the follow-on latch operation and improves the setup behavior of the CML latch 300. The final voltage of the transparent phase or the initial voltage of the latch phase is thus latched by the cross-coupled nMOS pair M22, M23.

Figure 4:
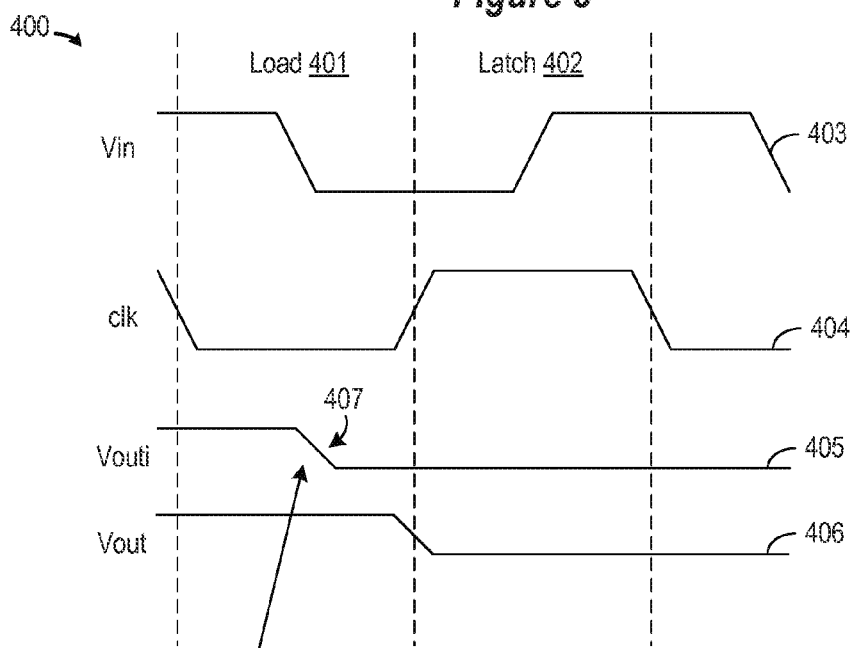
FIG. 4 shows a timing diagram the CML latch depicted in FIG. 3.

To illustrate the performance of the CML latch 300 shown in FIG. 3, reference is now made to FIG. 4 which depicts timing diagram 400 showing the input, clock and output signals that are applied during a load phase 401 and latch phase 402. As illustrated, the input signal Vin 403 is sampled at the rising edge of full-rate clock clk 404 using a load phase 401 and latch phase 402. In the load phase 401 when the input clock 404 is LOW, the input amplifier transistors M10, M11 sample the input signal 403, causing the internal or initial output signal Vouti 405 to follow the input signal Vin 403. However, the isolation pMOS transistors M20, M21 are turned OFF during the load phase 402, preventing the output voltage Vout 406 from following the internal/initial output signal Vouti 405. But during the latch phase 402 when the input clock 404 is HIGH, the isolation pMOS transistors M20, M21 are turned ON and the cross-coupled latch pair M22, M23 holds the output signal Vout 406 at the value sampled at the rising edge of clock clk 404. By including an isolation stage 302 in the CML latch as shown, the sample stage 301 effectively has a reduced time constant during the load phase 401, resulting in a faster edge transition rate 407 of the internal output signal 405, thereby effectively widening the data sampling eye and improving reliability and performance. In addition, the isolation stage 302 provides high impedance between the cross-coupled nodes at the gates of transistors M22, M23 during the load phase 401 to achieve a high cross-coupled gain, latch the signal rapidly, and produce a highly desirable wide-swing output.

Additional performance benefits may be achieved by including a mechanism in the CML latch circuit for removing or reducing previous state information from the output hold stage 503. To illustrated selected embodiments, reference is now made to FIG. 5 which shows a simplified circuit schematic diagram of a CML latch 500 with reset transistors M31, M32 for shorting the nodes of the cross-coupled latch pair M22, M23 in accordance with selected embodiments of the present disclosure. As depicted, the CML latch 500 includes an input sample stage 501 coupled across an isolation stage 502 to an output hold stage 503 substantially as described with reference to FIG. 3. However, the output hold stage 503 also includes pass gate transistors M31, M32 which are inserted between the output signal nodes Vout, Voutx for purposes of shorting the output signal nodes to equalize or nullify the previous state information at the nodes. As will be appreciated, the presence of the isolation stage 502 effectively separates the internal/initial output signals (outix, outi) from the output signal nodes Vout, Voutx, thereby allowing the pass gate transistors M31, M32 to short the output signal nodes Vout, Voutx during the load or transparent phase to further reduce hysteresis. In the depicted embodiments, the reset transistors M31, M32 may include an nMOS transistor M31 coupled between the output signal nodes Vout, Voutx and controlled by the complementary clock signal clkx so as to short the output signal nodes Vout, Voutx during the latch phase (when the complementary clock signal clkx is HIGH). In addition or in the alternative, the reset transistors M31, M32 may include a pMOS transistor M32 coupled between the output signal nodes Vout, Voutx and controlled by the clock signal clk so as to short the output signal nodes Vout, Voutx during the latch phase (when the clock signal clk is LOW).

Figure 5:
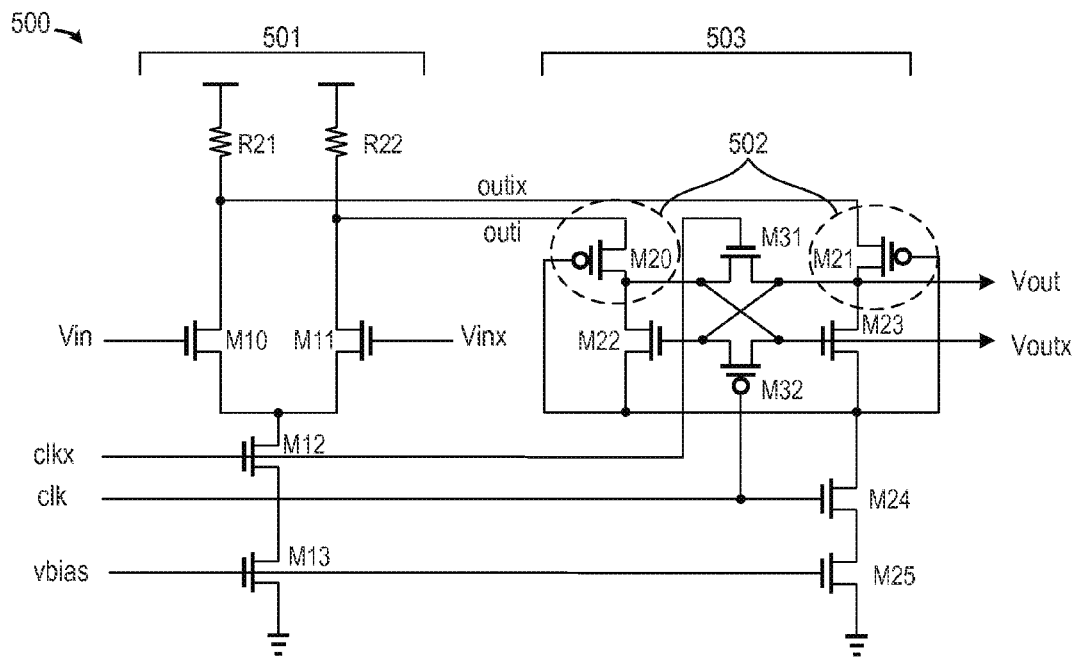
FIG. 5 shows a simplified circuit schematic diagram of a CML latch with reset transistors for shorting the nodes of the cross-coupled latch pair in accordance with selected embodiments of the present disclosure.
Figure 6:
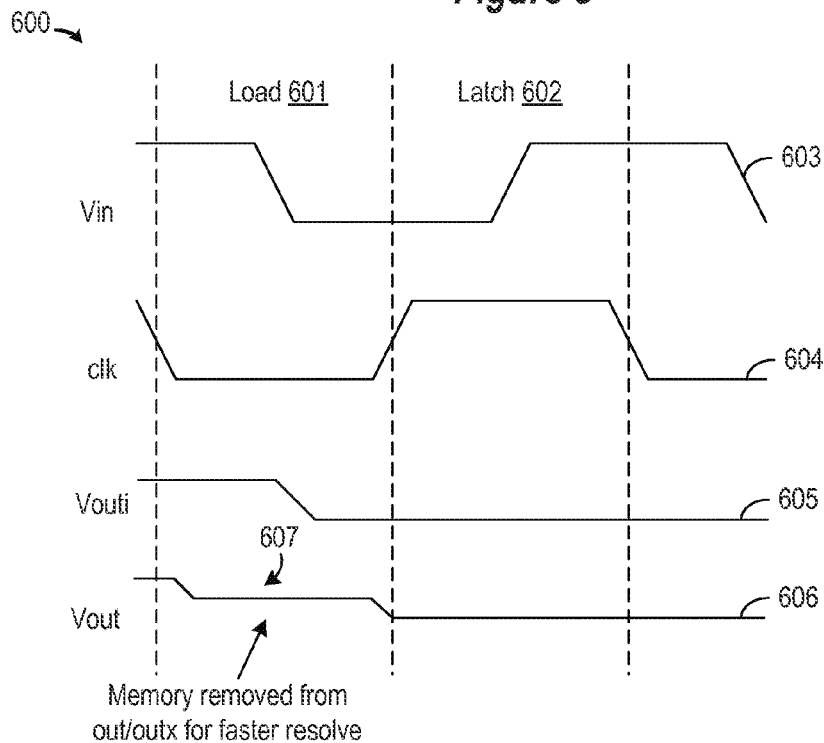
FIG. 6 shows a timing diagram the CML latch depicted in FIG. 5.

To illustrate the performance of the CML latch 500 shown in FIG. 5, reference is now made to FIG. 6 which depicts timing diagram 600 showing the input, clock and output signals that are applied during a load phase 601 and latch phase 602. As illustrated, the input signal Vin 603 is sampled at the rising edge of full-rate clock clk 604 using a load phase 601 and latch phase 602. In the load phase 601 when the input clock 604 is LOW, the input amplifier transistors M10, M11 sample the input signal 603, causing the internal or initial output signal Vouti 605 to follow the input signal Vin 603. However, the isolation pMOS transistors M20, M21 are turned OFF during the load phase 602, preventing the output voltage Vout 606 from following the internal/initial output signal Vouti 605. In addition, the input clock signal clk 604 in the load phase 601 turns ON the pass gate transistors M31, M32, effectively removing memory of the previous state from the output signal nodes Vout, Voutx as indicated at 607. During the latch phase 602 when the input clock 604 is HIGH, the pass gate transistors M31, M32 are turned OFF and the isolation pMOS transistors M20, M21 are turned ON, allowing the cross-coupled latch pair M22, M23 to hold the output signal Vout 606 at the value sampled at the rising edge of clock clk 604. By including pass gate transistors M31, M32 in the CML latch to short the output signal nodes Vout, Voutx as shown, the sample stage 301 effectively has a reduced hysteresis, resulting in a faster edge transition rate of the output signal Vout 606, thereby effectively widening the data sampling eye and improving reliability and performance.

Figure 7:
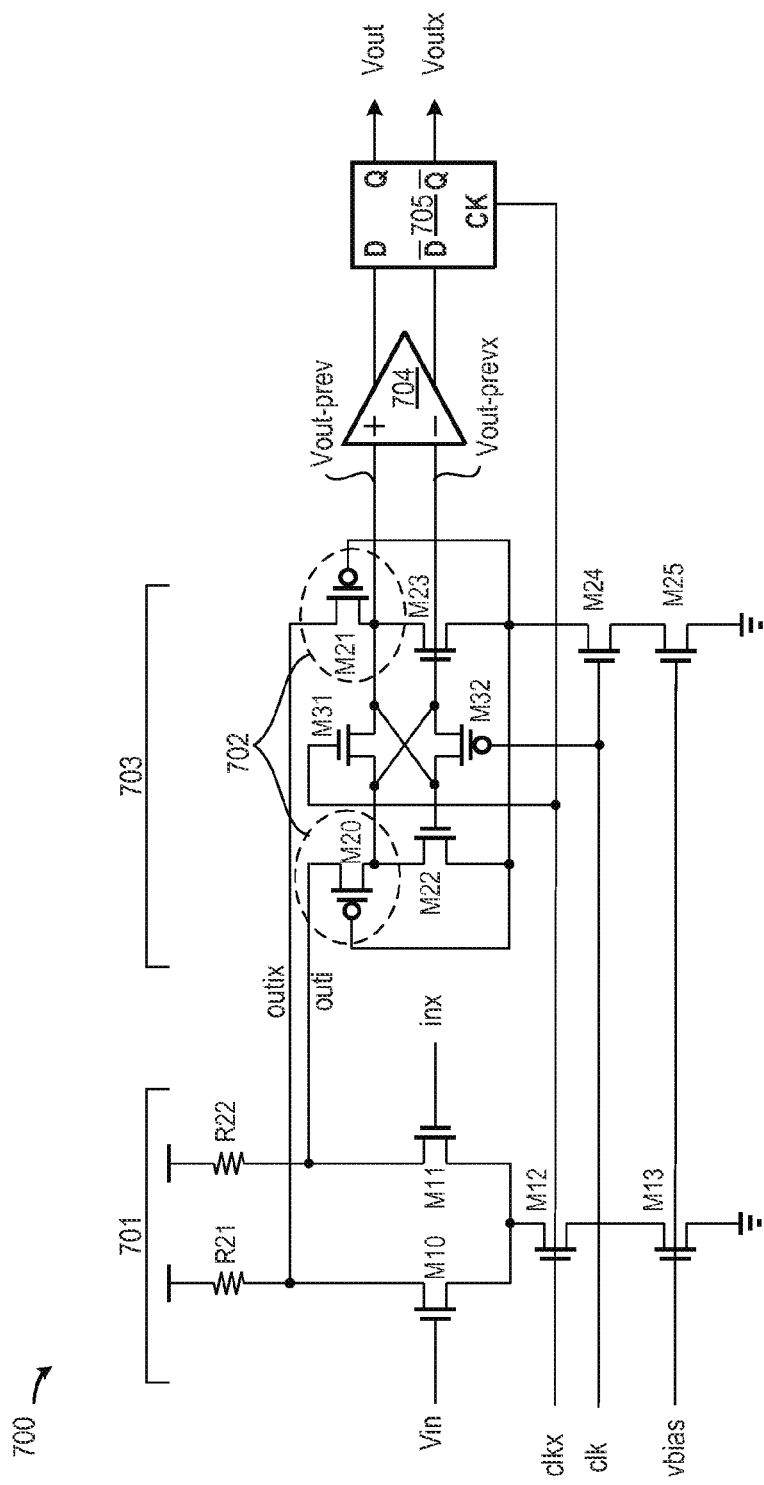
FIG. 7 shows a simplified circuit schematic diagram of a CML latch with a gain stage and output differential latch in accordance with selected embodiments of the present disclosure.

As will be appreciated, the use of the pass gate transistors M31, M32 to short the output signal nodes Vout, Voutx can pose challenges to applications needing to access the previously latched output values. Therefore, it may be useful to provide a mechanism for holding the previously latched output values that does not interfere with the performance of the low-hysteresis latch circuit disclosed herein. While a variety of data hold circuits may be added to the latch circuit, FIG. 7 shows a simplified circuit schematic diagram of a CML latch 700 which includes a sample stage 701, isolation stage 702, and hold stage 703 with pass gate transistors substantially as described with reference to FIG. 5. In addition, the CML latch 700 includes a gain stage 704 and output differential latch 705 which are connected to hold the previously latched output values Vout-prev, Vout-prevx. The gain stage 704 may be implemented as a differential amplifier connected to receive the previously latched output values Vout-prev, Vout-prevx generated by the hold stage 703, and to generate therefrom amplified output signals which are captured by a differential latch 705, such as a D-flip flop latch that is clocked by the complementary clock signal clkx. In this way, previously latched output values Vout-prev, Vout-prevx are held at the differential latch 705 while the next input voltage Vin sample is loaded by the sample stage 701 and the cross-coupled latch pair M22, M23 are isolated and shorted in the hold stage 703.

Figure 8:
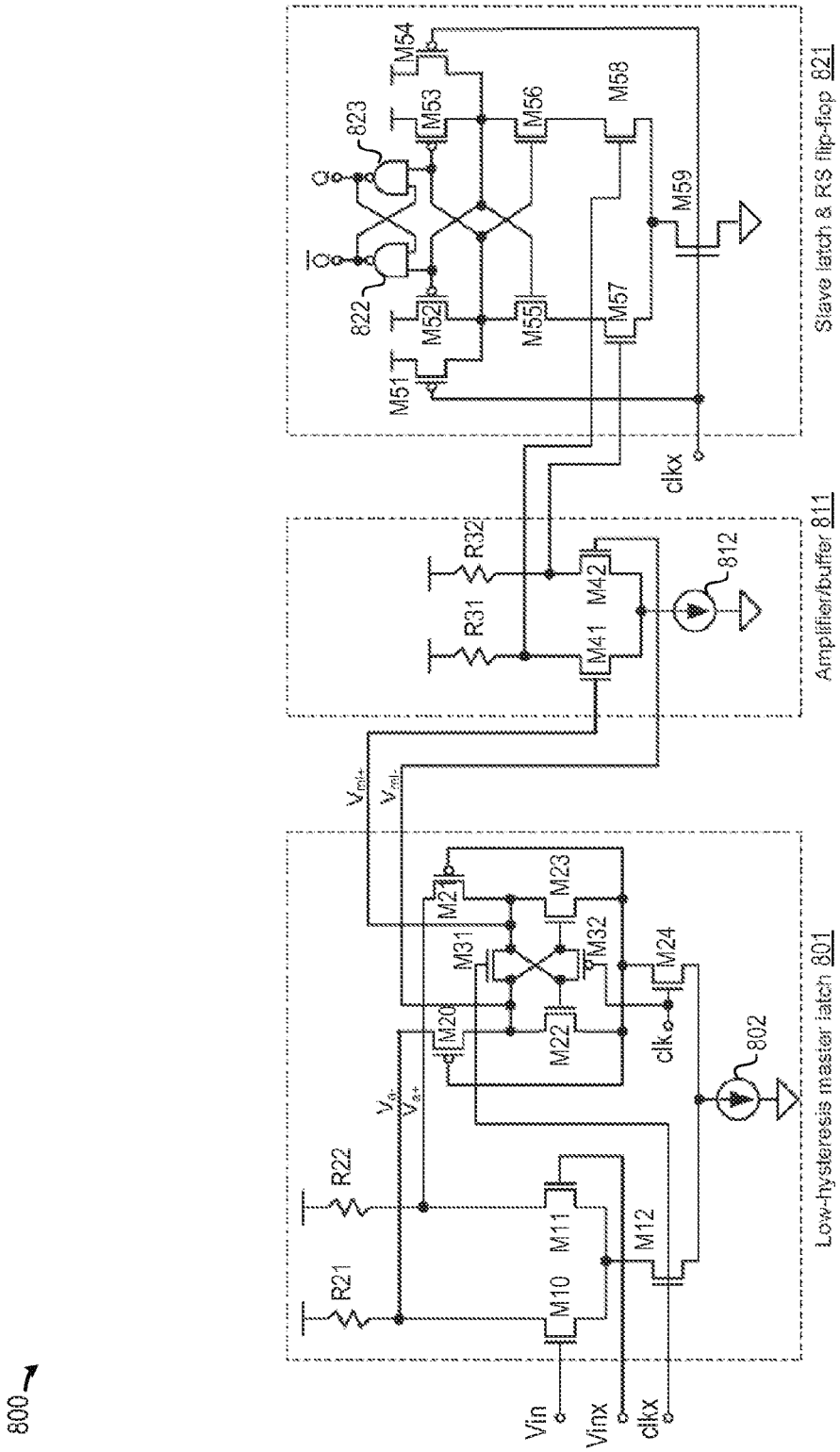
FIG. 8 shows a simplified circuit schematic diagram of a low-blind-period differential sampler for high-speed serial link receivers in accordance with selected embodiments of the present disclosure.

The low-hysteresis latch circuit disclosed herein may be used in a variety of applications. For example, FIG. 8 shows a simplified circuit schematic diagram of a low-blind-period differential sampler 800 for high-speed serial link receivers in accordance with selected embodiments of the present disclosure. As depicted, the differential sampler 800 includes a low-hysteresis master latch 801, amplifier or buffer stage 811, and an output stage 821 formed with a sense-amplifier-based latch followed by an RS flip-flop. The low-hysteresis master latch 801 operates substantially as described with reference to the latch 500 shown in FIG. 5. The amplifier or buffer stage 811 may be formed with differential nMOS transistors M41, M42 coupled between the resistance loads R31, R32 and a current source 812. The output stage 821 includes a sense amplifier formed with first and second cross-coupled CMOS inverters M52/M55, M53/M56 coupled to receive the differential output from the amplifier/buffer 811 via input transistors M57, M58 under control of the slave latch transistors M51, M54, M59 clocked by the complementary clock signal clkx so as to deliver the RS flip-flop outputs, Q, QNOT via NAND gates 822, 823. The sense amplifier followed by an RS flip-flop is chosen to produce a full-swing output without additional conversion circuitry. Because of the large swing in the slave stage, a differential amplifier or buffer 811 is used to reduce the reverse leakage back into the master latch 810.

Figure 9:
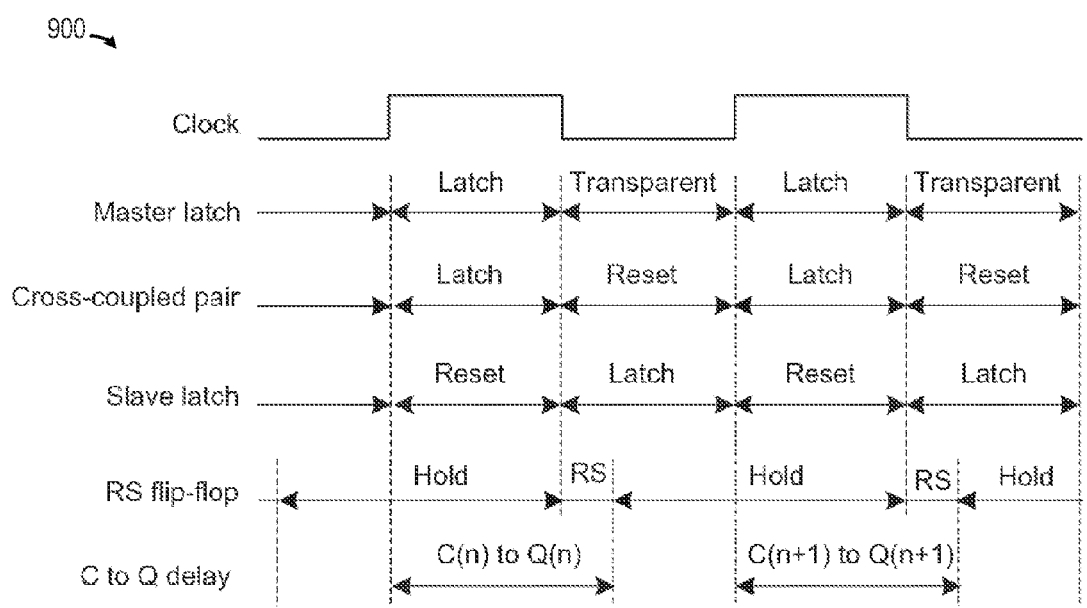
FIG. 9 shows a timing diagram the differential sampler depicted in FIG. 8.

FIG. 9 is an operation timing diagram 900 to show the operation of the differential sampler depicted in FIG. 8. When Clock (e.g., clk) is LOW, the master latch 801 is in the transparent phase to track the input signal Vin. As soon as the Clock signal goes HIGH, the master latch 801 starts to latch the input signal. At the end of the latch operation, Clock goes low, and the master latch 801 thereby returns to the (next) transparent phase. In operation, the slave latch 821 starts to latch the output of the master latch 801, while the cross-coupled transistor pair M22, M23 in the master latch 801 starts to reset as the reset transistors M31, M32 turn ON and the isolation transistors M20, M21 turn OFF. The amplifier/buffer 811 helps increase the timing margin of the latch operation because the master latch outputs (Vml+ and Vml−) from the master latch 801 are reset when the slave latch 821 starts to latch its input signal. By keeping the size of the buffer 811 small, the load to the master latch 801 is reduced. However, adding a small-size buffer stage 811 may increase the sensitivity of the mismatch in the slave stage 821 if the output swing of the master latch 801 is not large enough because the slave latch 821 might recognize the master latch output in the opposite polarity due to the large offset in the slave latch. Consequently, it is desirable to have a large swing at the master latch output to overcome the mismatch in the slave stage. Because there is no transparent phase in the slave latch 821 and an RS flip-flop is employed to finally hold the sampled value for clock period, the clock-to-Q delay of the differential sampler is half the clock period plus the delay of the sense amplifier and the RS flip-flop.

As disclosed herein, the hysteresis in the master latch 801 is reduced by reducing the initial voltage of the transparent phase without creating an additional reset phase or reducing the latch output swing while simultaneously providing a differential sampler circuit that is highly immunized to the noise and mismatch or the offset of the slave stage 821.

To reduce the hysteresis in the master latch 801, a pair of pMOS transistors M20, M21 was added between the input nMOS pair M10, M11 and the cross-coupled pair M22, M23. When the latch is in the latch phase, the pMOS transistors M20, M21 exhibit low impedance between the nodes of Va+ and Va− to significantly reduce their swings or the initial voltage of the following transparent phase. In the meantime, the pMOS pair M20, M21 provides high impedance between the cross-coupled nodes (Vml+ and Vml−) to achieve a high cross-coupled gain, latch the signal rapidly, and produce a highly desirable wide-swing output. At the beginning of the latch phase, the pMOS pair M20, M21 also acts as a common-gate amplifier to amplify voltages Va+ and Va− pass them onto nodes Vml+ and Vml−. This helps speed up the follow-on latch operation and improves the setup behavior of the master latch 801.

Second, because the pMOS pair M20, M21 separates the cross-coupled nodes (Vml+ and Vml−) from the output (Va+ and Va−) of the input nMOS pair M10, M11 during the load phase, the cross-coupled nodes (Vml+ and Vml−) can be shorted during the following transparent phase to reduce hysteresis in the latch further. This is achieved by adding a CMOS pass gate M31, M32 between nodes Vml+ and Vml−. Finally, the separation of the cross-coupled transistors M22, M23 and input pairs M10, M11 allows the load resistors R1 and R2 to be reduced to thereby increase the input pair bandwidth while keeping enough cross-coupled gain at the cross-coupled nodes.

Based on simulation and testing, the low-blind-period differential sampler 800 exhibits a significant improvement on the blind period and consumes approximately 25% less current. With the proposed sampler, the jitter requirement for the recovered clock is relaxed, and the required gain of a high-speed receiver analog front end is reduced to achieve a wide signal bandwidth. In addition, the differential sampler 800, when operating at 10 Gb/s, exhibits a blind period of approximately 2 ps for the eye height of 40 mV, whereas the conventional CML sampler exhibits a blind period of 33 ps under the same condition.

By now it will be appreciated that there is disclosed herein a latch circuit and associated method of operation. In the disclosed methodology, data is loaded onto one or more initial output nodes in an input sample stage that is isolated from an output hold stage by an isolation circuit during a loading phase of a first clock signal. To promote data loading, a pair of isolation transistors configured as a common-gate buffer are turned off to disconnect the initial output nodes from the output nodes during the loading phase of a first clock signal. In addition, data is latched from the one or more initial output nodes across the isolation circuit and into one or more output nodes of the output hold stage during a latch phase of the first clock signal. To promote data latching, the isolation transistors are turned on to connect the initial output nodes to the output nodes during the latch phase of a first clock signal. In selected embodiments, the data is loaded by applying first and second input data signals to a pair of differential transistors forming an input amplifier for receiving first and second input signals and generating first and second initial output signals at first and second internal initial output nodes, respectively, during the loading phase of a first clock signal. In these embodiments, the data is latched by transferring the first and second initial output signals from first and second internal initial output nodes across first and second isolation transistors to first and second cross-coupled transistors forming an output latch for receiving first and second initial output signals and generating first and second output signals at first and second output nodes during the latch phase of the first clock signal. In addition, the one or more output nodes in the output hold stage may be reset or connected during the loading phase of the first clock signal, and then disconnected in the output hold stage during the latch phase of the first clock signal. In other embodiments, data from the one or more output nodes of the output hold stage is stored at a storage device during the load phase of the first clock signal.

In another form, there is provided a differential sampler for a high-speed serial link receiver which includes a low-hysteresis master latch, a buffer stage, and a slave latch. The low-hysteresis master latch includes an input amplifier connected via an isolation circuit to first and second output nodes in an output latch so that the input amplifier is disconnected from the first and second output nodes during a loading phase of a first clock signal, and is connected to the first and second output nodes during a latch phase of the first clock signal. The low-hysteresis master latch may also include one or more transistors coupled between the first and second output nodes and controlled to electrically connect the first and second output nodes during the load phase of the first clock signal. In selected embodiments, the buffer stage is connected between the low-hysteresis master latch and the slave latch for amplifying first and second output signals at the first and second output nodes. The slave latch is connected directly or indirectly to the first and second output nodes of the output latch of the low-hysteresis master latch, and may include a sense-amplifier-based latch followed by an RS flip-flop circuit.

Although the described exemplary embodiments disclosed herein are directed to selected CML latch embodiments and methods for using same in low-blind-period differential sampler applications for high-speed serial links, the present invention is not necessarily limited to the example embodiments which illustrate inventive aspects of the present invention that are applicable to a wide variety of memory types, processes and/or designs. Thus, the particular embodiments disclosed above are illustrative only and should not be taken as limitations upon the present invention, as the invention may be modified and practiced in different but equivalent manners apparent to those skilled in the art having the benefit of the teachings herein. Accordingly, the foregoing description is not intended to limit the invention to the particular form set forth, but on the contrary, is intended to cover such alternatives, modifications and equivalents as may be included within the spirit and scope of the invention as defined by the appended claims so that those skilled in the art should understand that they can make various changes, substitutions and alterations without departing from the spirit and scope of the invention in its broadest form. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention, it being understood that various changes may be made in the function and arrangement of elements described in an exemplary embodiment without departing from the scope of the invention as set forth in the appended claims and their legal equivalents.

Accordingly, the particular embodiments disclosed above are illustrative only and should not be taken as limitations upon the present invention, as the invention may be modified and practiced in different but equivalent manners apparent to those skilled in the art having the benefit of the teachings herein. Accordingly, the foregoing description is not intended to limit the invention to the particular form set forth, but on the contrary, is intended to cover such alternatives, modifications and equivalents as may be included within the spirit and scope of the invention as defined by the appended claims so that those skilled in the art should understand that they can make various changes, substitutions and alterations without departing from the spirit and scope of the invention in its broadest form.

What is claimed is:

1. A latch circuit comprising:
   a sample circuit stage comprising an input amplifier for receiving a first input signal and generating a first internal output signal at a first internal node during a load clock phase;
   an isolation circuit stage coupled between the first internal node and a first output node of the latch circuit, where the isolation circuit stage is controlled to electrically isolate the first internal node from the first output node during the load clock phase, and to electrically connect the first internal node to the first output node during a latch clock phase; and
   a hold circuit stage comprising a pair of cross-coupled transistors forming an output latch for receiving the first internal output signal and generating first and second output signals at first and second output nodes of the latch circuit during the latch clock phase.

2. The latch circuit of claim 1, further comprising a reset circuit coupled between the first and second output nodes for electrically connecting the first and second output nodes during the load clock phase.

3. The latch circuit of claim 2, where the reset circuit comprises:
   a first pMOS transistor coupled between the first and second output nodes and gated by a first clock signal; and
   a second nMOS transistor coupled between the first and second output nodes and gated by a second complementary clock signal.

4. The latch circuit of claim 1, where the sample circuit stage comprises a pair of differential transistors forming an input amplifier for receiving first and second input signals and generating first and second internal output signals at first and second internal nodes, respectively, during the load clock phase.

5. The latch circuit of claim 4, where the isolation circuit stage comprises first and second pMOS transistors controlled by a first clock signal, where the first pMOS transistor is coupled between the first internal node and the first output node of the latch circuit, and where the second pMOS transistor is coupled between the second internal node and a second output node of the latch circuit.

6. The latch circuit of claim 5, where the first and second pMOS transistors are configured as a common-gate buffer stage which provides low impedance during the load clock phase to limit the differential swing of the first and second internal output nodes, and which provides high impedance for the cross-coupled transistors during the latch clock phase.

7. The latch circuit of claim 1, where the sample circuit stage is controlled by a first clock signal, and where the hold circuit stage is controlled by a second complementary clock signal.

8. The latch circuit of claim 2, further comprising:
   a gain circuit stage coupled to the first and second output nodes for amplifying the first and second output signals; and
   an output latch stage coupled to the gain circuit stage for holding the amplified first and second output signals.

9. The latch circuit of claim 8, where the gain circuit stage comprises a differential amplifier, and where the output latch comprises a D flip-flop which stores the amplified first and second output signals during the load clock phase.

10. The latch circuit of claim 1, where the latch circuit is implemented as a PCI Express bus.

11. The latch circuit of claim 1, where the latch circuit is implemented as a HyperTransport bus.

12. A method for latching data, comprising:
loading data onto one or more initial output nodes in an input sample stage that is isolated from an output hold stage by an isolation circuit during a loading phase of a first clock signal; and
latching data from the one or more initial output nodes across the isolation circuit and into one or more output nodes of the output hold stage during a latch phase of the first clock signal.

13. The method of claim 12, where loading data comprises applying first and second input data signals to a pair of differential transistors forming an input amplifier and generating first and second initial output signals at first and second internal output nodes, respectively, during the loading phase of a first clock signal.

14. The method of claim 13, where latching data comprises transferring the first and second initial output signals from first and second internal output nodes across first and second isolation transistors to first and second cross-coupled transistors forming an output latch for receiving first and second initial output signals and generating first and second output signals at first and second output nodes during the latch phase of the first clock signal.

15. The method of claim 12, where loading data comprises turning off a pair of isolation transistors configured as a common-gate buffer to disconnect the initial output nodes from the output nodes during the loading phase of a first clock signal.

16. The method of claim 15, where latching data comprises turning on the pair of isolation transistors configured as a common-gate buffer to connect the initial output nodes to the output nodes during the latch phase of a first clock signal.

17. The method of claim 12, further comprising resetting the one or more output nodes in the output hold stage during the loading phase of the first clock signal.

18. The method of claim 17, further comprising disconnecting the one or more output nodes in the output hold stage from one another during the latch phase of the first clock signal.

19. The method of claim 12, further comprising storing data from the one or more output nodes of the output hold stage at a storage device during the load phase of the first clock signal.

20. A differential sampler for a high-speed serial link receiver, comprising:
a low-hysteresis master latch comprising an input amplifier connected via an isolation circuit to first and second output nodes in an output latch so that the input amplifier is disconnected from the first and second output nodes during a loading phase of a first clock signal, and is connected to the first and second output nodes during a latch phase of the first clock signal; and
a slave latch connected directly or indirectly to the first and second output nodes of the output latch of the low-hysteresis master latch.

21. The differential sampler of claim 20, where the low-hysteresis master latch comprises one or more transistors coupled between the first and second output nodes and controlled to electrically connect the first and second output nodes during the load phase of the first clock signal.

22. The differential sampler of claim 20, further comprising a buffer stage connected between the low-hysteresis master latch and the slave latch for amplifying first and second output signals at the first and second output nodes.

23. The differential sampler of claim 20, where the slave latch comprises a sense-amplifier-based latch followed by an RS flip-flop circuit.

* * * * *